(12) United States Patent
Sunaga et al.

(10) Patent No.: US 6,639,834 B2
(45) Date of Patent: Oct. 28, 2003

(54) DATA REGISTER AND ACCESS METHOD THEREOF

(75) Inventors: Toshio Sunaga, Ohtsu (JP); Hisatada Miyatake, Ohtsu (JP); Koji Kitamura, Shiga-ken (JP); Hideo Asano, Machida (JP); Kohki Noda, Fujisawa (JP); Hiroshi Umezaki, Fujisawa (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/134,101

(22) Filed: Apr. 26, 2002

(65) Prior Publication Data

US 2002/0181275 A1 Dec. 5, 2002

(30) Foreign Application Priority Data

| Apr. 27, 2001 | (JP) | ......................... 2001-130652 |
| Jun. 29, 2001 | (JP) | ......................... 2001-199556 |

(51) Int. Cl.[7] .............................................. G11C 16/04
(52) U.S. Cl. ................... 365/185.05; 365/171
(58) Field of Search .......................... 365/185.05, 171, 365/173, 154, 185.09, 185.11

(56) References Cited

U.S. PATENT DOCUMENTS 6,324,096 B1 * 11/2001 Tomita ................... 365/185.05
6,442,092 B1 *  8/2002 Tomita ........................ 365/219

* cited by examiner

*Primary Examiner*—Anh Phung
(74) *Attorney, Agent, or Firm*—Daryl K. Neff

(57) ABSTRACT

The register disclosed herein includes a register block and a data writing block having non-volatile storage elements which store data output therefrom. The disclosed register further includes a data restoring block for reading data from the non-volatile storage elements. In a disclosed embodiment, the non-volatile storage elements are magnetic tunnel junction (MTJ) elements.

15 Claims, 4 Drawing Sheets

[Figure 3]
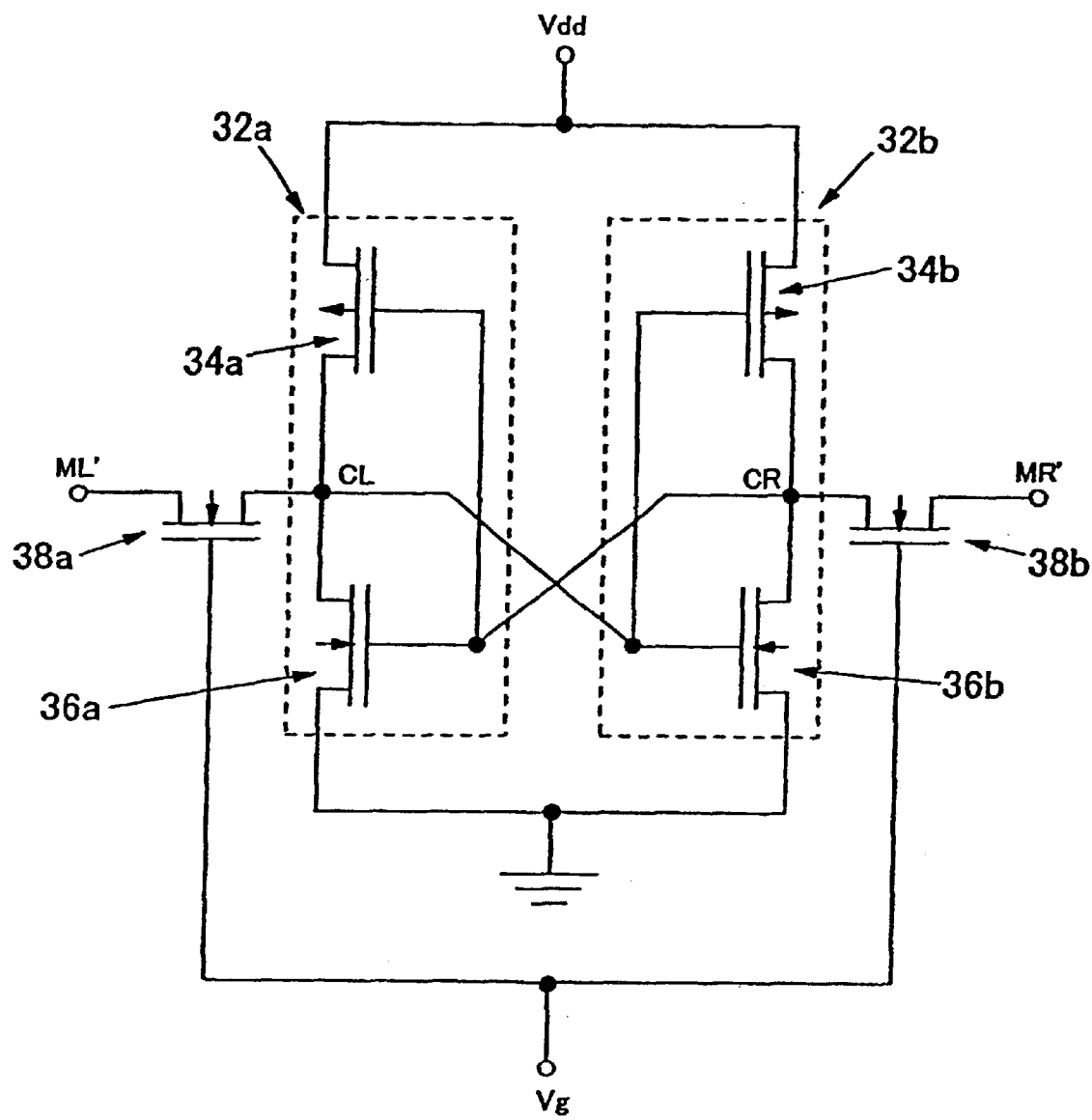

[Figure 4]
PRIOR ART
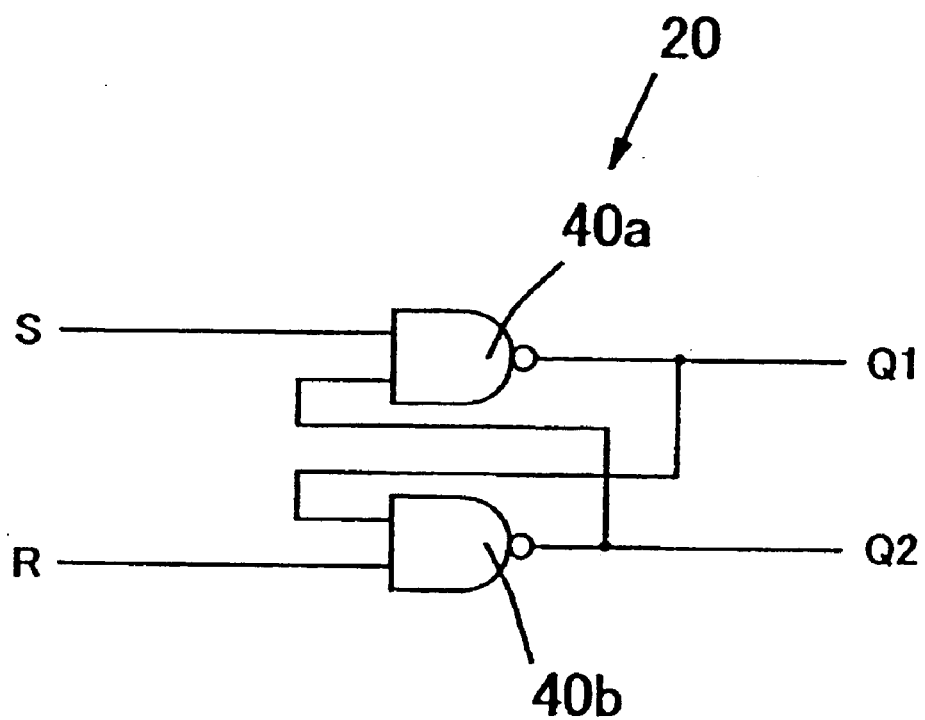

DATA REGISTER AND ACCESS METHOD THEREOF

FIELD OF THE INVENTION

The present invention relates to a non-volatile storage element to be integrated on a semiconductor chip, more particularly to a register that employs MTJ (Magnetic Tunnel Junction) elements used in an MRAM (Magnetic Random Access Memory), as well as a data storing method and a data reading method to be employed for the register.

BACKGROUND OF THE INVENTION

A register block 20 is a circuit block used to store data temporarily. The register block 20, as shown in FIG. 4, is composed of a flip-flop circuit formed with a combination of NAND circuits 40a and 40b. The register block stores "0" or "1" data according to the combination of signals entered to the input lines S and R.

In the register block 20, when a "High" level signal is entered to the input line S and a "Low" level signal is entered to the input line R, the level of the Q2 line becomes "High" and that of the Q1 line becomes "Low". When a "High" level signal is entered to the input line R and a "Low" level signal is entered to the input line S, the level of the Q1 line becomes "High" and that of the Q2 line becomes "Low". The levels of the input lines S and R are decided by the data written in the register in such way. When a "High" signal is entered to each of the input lines S and R concurrently, the data entered to the register block 20 is held. Generally, when a "Low" signal is entered to each of the input lines S and R concurrently, the state of the register block 20 cannot be estimated, so that "Low" signals are never entered to the input lines S and R concurrently.

Conventionally, a latching circuit/register built in a logic chip loses data stored therein when the power supply is turned off. This is because data is stored in such a volatile storage element as a capacitor or a static latch. Consequently, the use of a non-volatile storage elements is very advantageous for many system application programs.

There are also non-volatile semiconductor memory chips such as flash memories. However, none of designing and development has been made for any logic chip provided with built-in non-volatile storing functions. This is because the logic chip, when it is provided with an internal non-volatile memory such as a flash memory, is more complicated than the conventional semiconductor logic chip. In addition, any of the existing semiconductor chip manufacturing processes cannot incorporate such a non-volatile storage element as a flash memory in a logic chip. Consequently, none of the logic chips provided in existing computer systems and used for application programs has such the non-volatile data storing function.

Under such circumstances, it is an object of the present invention to provide a register provided with functions for storing data into non-volatile storage elements, as well as a data storing method and a data reading method to be employed for the register.

SUMMARY OF THE INVENTION

In order to achieve the above object, the register of the present invention includes a register block for storing data; a data writing block provided with a non-volatile storage element enabled to store the data; and a data restoring block for reading data from the data writing block.

The data storing method of the present invention includes a step of outputting a high level signal from one of first and second logic circuits according to the data output from the register block; the high level signal turning on one of two pairs of switches connected to the first and second logic circuits, respectively, and writing data in the two storage elements with polarity according to which of the first and second pairs of switches is turned on.

The data reading method of the present invention includes a step of generating, with current mirror circuit, a differential signal according to the resistance values of the first and second storage elements, amplifying the differential signal, and holding the amplified differential signal.

A logic chip including the present invention is preferably configured so as to include magnetic tunnel junction (MTJ) elements, which are non-volatile storage elements. Thereby the logic chip can be designed and manufactured easily and the manufacturing cost can be reduced. In addition, because the logic chip uses non-volatile storage elements, data can be stored in them even after the power is turned off. Preferably, such non-volatile storage elements having MTJ elements are constructed so as to consume no power when power to the logic chip is turned off.

BRIEF DESCRIPTION OF THE DRAWINGS

FIG. 3 is a circuit diagram including a pair of cross-coupled CMOS inverters used to hold data; and FIG. 4 is a circuit diagram used for a general register block.

DETAILED DESCRIPTION OF THE PREFERRED EMBODIMENT

Hereunder, the preferred embodiment of the present invention for the register, the data storing method, and the data reading method will be described with reference to the accompanying drawings.

Figure 1:
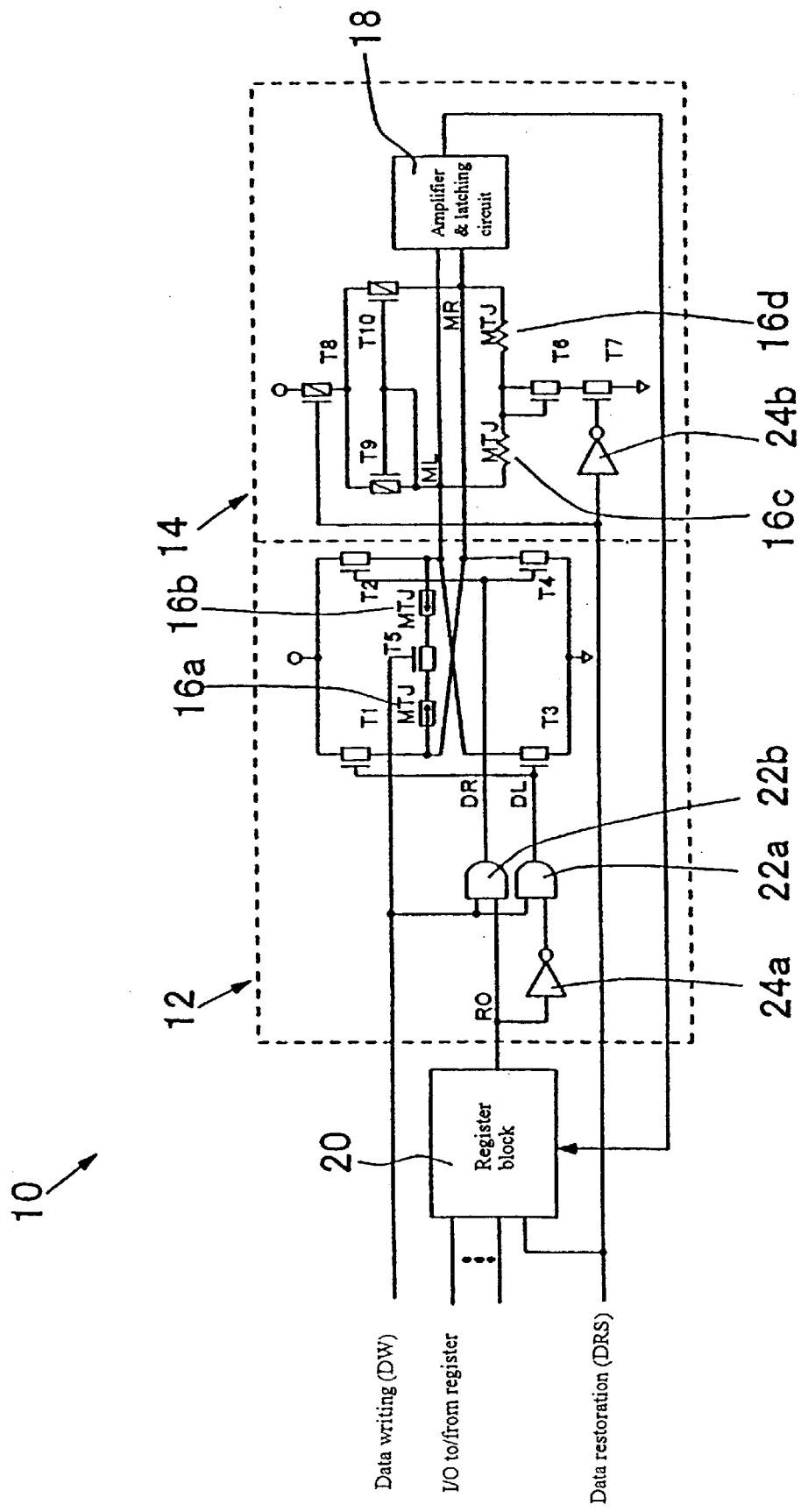
FIG. 1 is a block diagram of a register of the present invention.

FIG. 1 is a block diagram of the register of the present invention. As shown in FIG. 1, the register 10 is provided with a conventional register block 20, as well as a data writing block 12 for storing the data transferred from the register block 20 temporarily and a data restoring block 14 for restoring data from the data writing block 12. In FIG. 1, the register 10 functions as a single bit register or a single bit latch. A general multi-bit register has the above blocks for each bit.

The data writing block 12 is provided with MTJ (Magnetic Tunnel Junction) elements 16a and 16b, which are non-volatile storage elements. The MTJ elements 16a and 16b are used as memory cells of an MRAM (Magnetic Random Access Memory).

Figure 2:
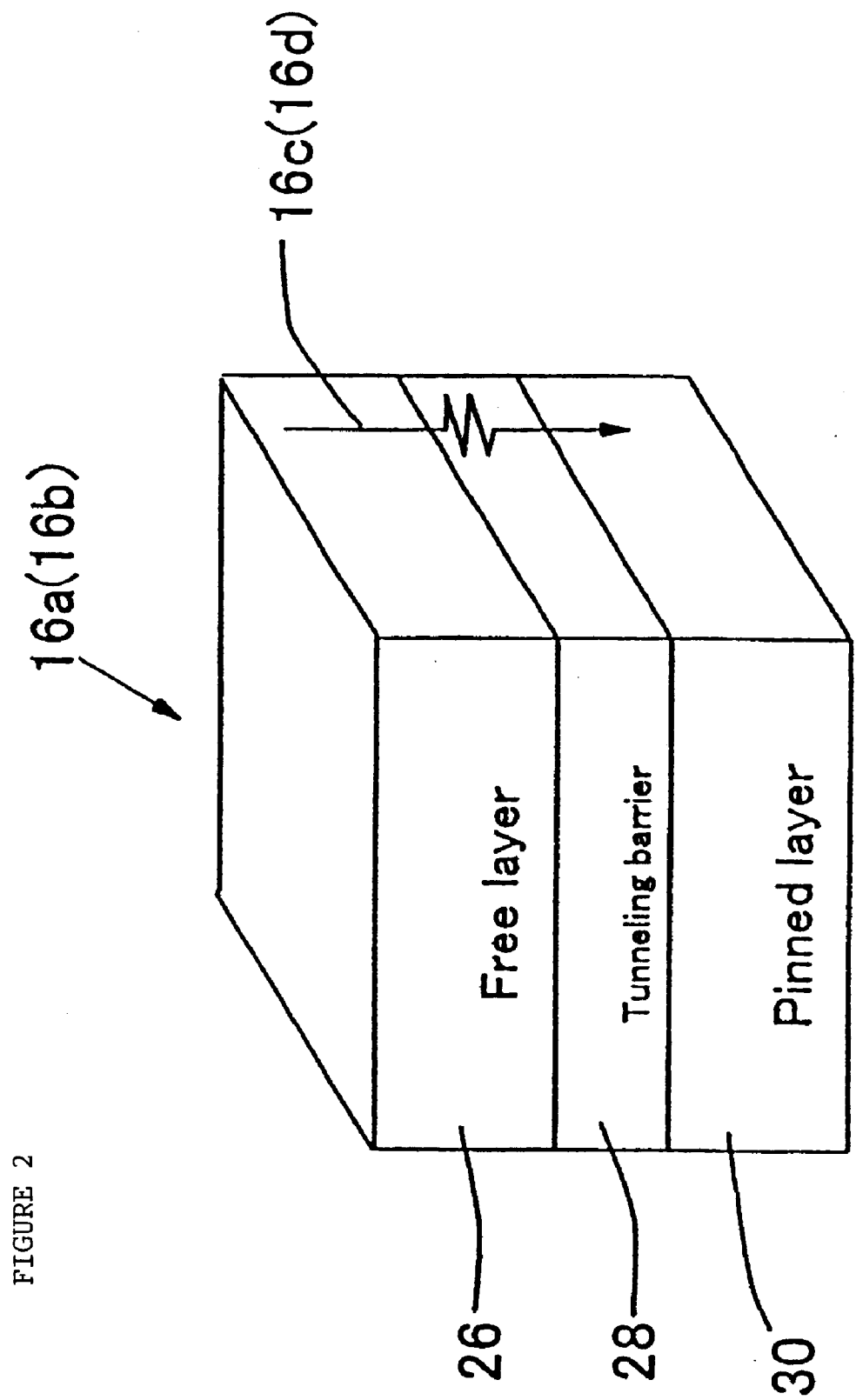
FIG. 2 is a structure of an MTJ element.

The general MTJ element 16a, as shown in FIG. 2, is structured as a combined layer composed of a free layer 26, which is formed with a ferromagnetic material, a tunneling barrier 28, and a pinned layer 30, which is formed with a ferromagnetic material. The magnetizing direction in the pinned layer 30 is fixed. The magnetizing direction in the free layer 26 can be changed according to the direction of an external magnetic field. The value of the data to be stored is distinguished between "0" and "1" according to how the magnetizing directions in the pinned layer 30 and in the free layer 26 are combined. For example, when the magnetizing directions in the pinned layer 30 and in the free layer 26 are identical, the resistance of the MTJ element is low, thereby the data value becomes "0". When the magnetizing directions are opposite to each other, the resistance of the MTJ element is high, thereby the data value becomes "1".

The data writing block 12 includes an AND circuit 22b for receiving data from the register block 20; a NOT circuit 24a for inverting the data value; and an AND circuit 22a for receiving data from the NOT circuit 24a. When the NOT circuit 24a and the AND circuit 22a are united into a logic circuit, the data writing block 12 comes to include two logic circuits (the united logic circuit and the AND circuit 22b). In addition, each of the AND circuits 22a and 22b receives a signal via the data write (DW) line. The levels of the signals output from the AND circuits 22a and 22b are fixed at "Low" while a "Low" signal is entered to the data write (DW) line.

The two MTJ elements 16a and 16b are connected to each other via a switch T5. The two MTJ elements 16a and 16b are composed so that the magnetizing directions in their pinned layers are opposite to each other. For example, the pinned layers are disposed so as to face each other with the switch T5 therebetween as shown with the arrows the figure.

Switches T1 to T4 are connected to the MTJ elements 16a and 16b. Those switches T1 to T4 are used together with the above switch T5 so as to form an electrical path of the data writing block 12. For example, when the switches T1, T3, and T5 are turned on, the switch T1, the MTJ element 16a, the switch T5, the MTJ element 16b, and the switch T3 are connected serially, thereby an electrical path is formed. And, when the switches T2, T4 and T5 are turned on, the switch T2, the MTJ element 16b, the switch T5, the MTJ element 16a, and the switch T4 are connected serially, thereby another electrical path is formed. In FIG. 1, when a current flow from left to right in the switch T5, the magnetizing directions in both pinned and free layers in the MTJ element 16a are identical, thereby "0" data is written in the MTJ element 16a. However, the magnetizing direction in the pinned layer is opposite to that in the free layer in the MTJ element 16b, thereby "1" data is written in the MTJ element 16b. On the contrary, when a current flows from right to left in the switch T5, the magnetizing directions are identical in both pinned and free layers in the MTJ element 16b, thereby "0" data is written in the MTJ element 16b. However, the magnetizing directions in both pinned and free layers in the MTJ element 16a are opposite to each other, thereby "1" data is written in the MTJ element 16a. In any of the above cases, either True or Complement data is written in each of the MTJ elements 16a and 16b.

When a "High" level signal is output from the AND circuit 22a, the switches T1 and T3 are turned on. When a "High" level signal is output from the AND circuit 22b, the switches T2 and T4 are turned on. The switch T5 is turned on when a "High" level signal is entered to the data write line.

The data restoring block 14 includes MTJ elements 16c and 16d. The MTJ elements 16c and 16d are resistors of the MTJ elements 16a and 16b. Although they are shown separately for siimplicity in FIG. 1, 16a and 16c are physically one single MTJ element as shown in FIG. 2, so are 16b and 16d.

The data restoring block 14 is also provided with a switch T8 for receiving a signal (Data Restore: DSR) via the data restore line; a NOT circuit 24b; and a switch T7 for receiving a signal from the NOT circuit 24b. When a "Low" signal is entered to the data restore line, the switches T7 and T8 are turned on, thereby the switches T6, T9, and T10 are turned on automatically. The switches T6, T9, and T10 are included in the data restoring block 14. The switches T9 and T10 shown in FIG. 1 are included in a current mirror circuit. When all the switches in the data restoring block 14 are turned on, a differential signal (a different between signal levels of the nodes ML and MR) is output to a node between a pair of the MTJ elements 16c and 16d. Data is distinguished between "0" and "1" according to the value of this differential signal. The amplifier/latching circuit (AMP & Latch) 18 connected to the nodes ML and MR amplifies and holds the differential signal. Two cross-coupled CMOS inverters 32a and 32b are used to hold the data whose value is decided by the differential signal. FIG. 3 shows such circuit configuration for holding data. In the circuit, the two cross-coupled CMOS inverters CMOSFETs 32a and 32b work together so as to hold the data.

The switches T1 to T7 used for the data writing block 12 and the data restoring block 14 are all n-type MOSFETs. The switches T8 to T10 are p-type MOSFETs.

The register I/O lines are used to enter data to the register block 20. When a signal is entered to a data write line/data restore line, the data writing block 12/data restoring block 14 begins to work.

Next, the operation of the register 10 will be described. While the register 10 is operating, both of the data writing block 12 and the data restoring block 14 go idle upon a "Low" signal and a "High" signal received by the data write line and data restore line respectively. In this state, the register 10 sends/receives signals via the register I/O lines; the data writing block 12 and the data restoring block 14 are not started up at this time. A clock signal used as a timing signal for the operation of the register 10 is also included in the I/O signals to/from the register 10. The data stored in the register block 20 always appears on the node RO shown the figure. When the DW line level is fixed at "Low", however, both nodes DL and DR shown in FIG. 1 are fixed at "Low" by the AND circuits 22a and 22b. In FIG. 1, both nodes DL and DR are fixed at "Low" respectively, thereby the switches T1 to T4 are all turned off.

The register 10 then outputs a "High" signal onto the DW line, thereby turning on the switch T5 so as to write data. At the same time, the level of either the node DL or node DR becomes "High" due to the written data. For example, when a "High" signal is output from the register block 20, the level of the node DR becomes "High". When a "Low" signal is output from the register block 20, the level of the node DL becomes "High".

The arrow shown in FIG. 1 denotes the magnetizing direction in the pinned layer 30 of each of the MTJ elements 16a and 16b. The magnetizing directions in the pinned layers 30 of the MTJ elements 16a and 16b connected to each other via the switch T5 are opposite to each other. The data writing block 12 thus writes true "1" and complement "0" data items in the pair of the MTJ elements 16a and 16b. For example, when the level of the node DL is "High", the switches T1, T3, and T5 are turned on. Consequently, a current flows from the switch T1 to the left MTJ element 16a, the switch T5, the right MTJ element 16b, and the switch T3. The direction of the magnetic field generated by the current is the same as that of the magnetization in the pinned layer 30 of the left MTJ element 16a and opposite to that of the magnetization in the pinned layer 30 of the right MTJ element 16b. In this case, the magnetizing directions become identical in both of the pinned layer 30 and in the free layer of the left MTJ element 16a and opposite to each other in those layers of the right MTJ element 16b. When a "Low" signal is output from the register block 20, "0" data is written in the left MTJ element 16a and "1" data is written in the right MTJ element 16b. When the level of the node DR is "High", the switches T2, T4, and T5 are turned on. The combination of the magnetizing directions thus becomes opposite to that of the above example. The data to be stored in the data writing block 12 is thus decided by whether the DL line is driven to "High" or the DR line is driven to "High". As described above, data can be rewritten easily in the pair of the MTJ elements 16a and 16b. In addition, because data is non-volatile one, the data is kept as is even after the register power is turned off.

Because each conventional MRAM employs a matrix structure, a grid address is specified with a write word line and a bit line to flow and the current in the free layer. This is why switches are needed so as to switch among addresses to be specified more easily. When in writing operation in the register of the present invention, however, the method is different from that of the conventional MRAM, since the storage element is not matrix-structured with write word lines and bit lines. And, this is why write word lines are omitted from the storage element in the register of the present invention.

In a general MRAM that includes MTJ elements, memory arrays are matrix-structured as described above and an MTJ element is disposed at each cross point. In such the MTJ element, data is written at a cross point only when it is selected by a vertical bit line and a horizontal word line. A current is then flown in the write word line in addition to the bit line. On the contrary, the pair of the MTJ elements 16a and 16b shown in FIG. 1 are connected to each other via the switch T5 and the magnetizing directions in their pinned layers 30 are opposite to each other so as to face the switch T5 respectively as shown in FIG. 1. And, because the MTJ elements 16a and 16b of the present invention are not structured like the memory arrays of the above conventional MRAM, there is no need to specify any cross point by vertical and horizontal lines so as to write data there. In addition, it is also possible to use only a current flowing in a bit line so as to turn over the magnetizing direction in the free layer of an MTJ element in the conventional MRAM. Consequently, each storage element in the register of the present invention is composed by omitting write word lines of each MTJ element of the conventional MRAM. Through such write operations, a register transfers data to a memory composed basically of pairs of True and Complement storage elements for storing data with no power consumption.

In the above embodiment, pinned layers 30 are shown in the MTJ elements 16a, 16b in the data writing block 12 and resistors are shown in the MTJ elements 16c and 16d in the data restoring block 14 so as to simplify the description for the operation principle, the reference symbols 16a and 16c are physically a single element as shown in FIG. 2, so are 16b and 16d. The pair of MTJ elements 16c and 16d in the data restoring block 14 is used as resistors for a current mirror circuit (composed of the switches T9 and T10) in the above embodiment of the present invention.

When non-volatile data is to be read from the register 10, the level of the DW signal is kept at "Low". The DRS signal level is "High" at first, then shifted to "Low". When the signal level is shifted from "High" to "Low" such way, the switches T7 and T8 are turned on. Then, the switches T6, T9, and T10 are also actuated, thereby the current mirror circuit is enabled and the same value current flows in both of the switches T9 and T10.

A differential signal is then output to the nodes ML and MR of the pair of the MTJ elements 16c and 16d respectively. The differential signal appeared on the nodes ML and MR respectively is amplified in the amplifier/latching circuit 18 and held there. In other words, data decided by a potential difference between the nodes ML and MR is amplified by the amplifier/latching circuit 18 and held there. The potentials of the nodes ML and MR are decided by the resistance values of the MTJ elements 16c and 16d. Concretely, the potentials are decided by the data items written in the MTJ elements 16a and 16b.

Data is then held in the circuit shown in FIG. 3. The amplified potential of the node ML appears at the node ML' while the amplified potential of the node MR appears at the node MR'. The potentials of the nodes ML' and MR' then appear at the nodes CL and CR respectively when the n-type MOSFETs 38a and 38b are turned on. Two cross-coupled CMOS inverters are used in the circuit. When a "High" potential appears at the node CL, the potential at the node CR is kept at "Low". On the contrary, when the potential at the node CL is "High", the potential at the node CR is held at "Low".

In order to enter data to the register 10, the register block 20 fetches the data from the amplifier/latching circuit 18 with use of the DRS signal. The data restoration is completed by the above process. After this, the "Low" DRS signal level is returned to "High", thereby the current mirror circuit is turned off.

Table 1 below shows the signal state at each node and how data is stored in each MTJ element in the series of above processes.

TABLE 1

| | | |
|---|---|---|
| RO | High | Low |
| DR | High | Low |
| DL | Low | High |
| MTJ element 16a | "1" data | "0" data |
| MTJ element 16b | "0" data | "1" data |
| ML | High | Low |
| MR | Low | High |
| CL | High | Low |
| CR | Low | High |

MTJ elements can be mounted on the subject logic chip in the latter half stage of the semiconductor manufacturing process of metallic layers. Consequently, this manufacturing process of MTJ storage elements, which is simple and requires less cost, can also apply to other existing non-volatile storage elements to be employed for flash memories that require designing of transistors separately from that of logic circuits. The present invention therefore enables non-volatile storage elements to be mounted on any conventional logic chip.

Non-volatile storage elements can be employed for a wide variety of devices from respective single latching registers to multiple-bit registers. Storing data in a register with no power consumption will be useful for restoring an operating environment to before-power-off one. A non-volatile storing function to be changed by the electricity of a logic chip will thus come to be used very widely. The function can also change a logic function flexibly.

While a description has been made for methods for storing and reading data in/from the register of the present invention, the present invention is not limited only for the uses. For example, the MTJ elements may be replaced with GMR (Giant Magnetoresistive) elements. And, obviously many modifications and variations of the present invention are possible without departing from the spirit of the invention.

LIST OF SYMBOLS USED

10 . . . Register
12 . . . Data writing block
14 . . . Data restoring block
16a, 16b, 16c, . . . MTJ element
18 . . . Amplifier and latching circuit
20 . . . Register block
22a, 22b . . . AND circuit
24a, 24b . . . NOT circuit
26 . . . Free layer
28 . . . Tunneling barrier
30 . . . Pinned Layer
32a, 32b . . . CMOSFET
34a, 34b . . . p-type MOSFET
36a, 36b, 38a, 38b . . . n-type MOSFET
40a, 40b . . . NAND circuit

What is claimed is:

1. A register, comprising:
a register block for storing data;
a data writing block provided with a non-volatile storage element for storing data output from said register block; and
a data restoring block for reading data from said data writing block; wherein said storage element includes a pinned layer formed with a ferromagnetic material in which the magnetizing direction is fixed and a free layer formed with a ferromagnetic material in which the magnetizing direction can be changed.

2. The register according to claim 1 wherein said register includes at least first and second said non-volatile storage elements and said magnetizing direction is identical in both of said pinned layer and said free layer in said first non-volatile storage element and said magnetizing direction differs between said pinned layer and said free layer in said second storage element.

3. The register according to claim 2 wherein said first and said second storage elements are connected to each other via a switch.

4. The register according to claim 3 wherein said magnetizing directions in said pinned layers in said first and said second storage elements are in the forward or reverse direction of said switch.

5. The register according to claim 2 wherein said data restoring block includes a current mirror circuit adapted to generate a differential signal according to the resistance values of said first and said second storage elements.

6. The register according to claim 5 wherein said register includes a circuit for amplifying and holding said differential signal.

7. The register according to claim 6 wherein said circuit for amplifying and holding said differential signal includes a first CMOS inverter used to hold said differential signal.

8. The register according to claim 7 wherein said circuit further includes a second CMOS inverter cross-coupled to said first CMOS inverter.

9. The register according to claim 1 wherein said data writing block includes first and second logic circuits which receive data output from said register block and which output complementary high level and low level signals, respectively.

10. The register according to claim 9 wherein said register includes a plurality of switches enabled to receive signals output from said first and said second logic circuits.

11. The register according to claim 10 wherein at least two of a plurality of said switches are coupled to receive a signal output from at least one of said first and said second logic circuits.

12. The register according to claim 11 wherein said first and said second switches enabled to receive a signal from said logic circuit are connected to said first and said second storage elements via a switch that connects said first and said second storage elements.

13. The register according to claim 1 wherein said non-volatile storage element is of the MTJ (Magnetic Tunnel Junction) type.

14. A method for storing data in a register having a register block for storing data, a data writing block provided with first and second non-volatile storage elements for storing data output from said register block, and a data restoring block for reading data from said data writing block, said data writing block including first and second logic circuits which receive data output from said register block and which output complementary high level and low level signals, respectively, said data writing block further including first and second pairs of switches responsive to output of said first and said second logic circuits, respectively, said method comprising:
outputting a high level signal from one of said first and said second logic circuits according to data output from said register block, said high level signal turning on one of said first and said second pairs of switches, and
writing data into said first and said second non-volatile storage elements with polarity according to which of said first and said second pairs of switches is turned on.

15. The method of claim 14 wherein said data restoring block of said register includes a current mirror circuit for generating a differential signal according to the resistance values of said first and said second storage elements, said method further comprising:
generating a differential signal with said current mirror circuit;
amplifying said differential signal and holding said amplified differential signal.

* * * * *